United States Patent
Mori et al.

(10) Patent No.: US 11,250,906 B2
(45) Date of Patent: Feb. 15, 2022

(54) APPARATUS FOR COMPENSATING FOR RADIATION RESISTANCE OF SEMICONDUCTOR MEMORY, METHOD THEREFOR, AND ELECTRONIC CIRCUIT

(71) Applicant: MITSUBISHI HEAVY INDUSTRIES, LTD., Tokyo (JP)

(72) Inventors: Yoshiharu Mori, Tokyo (JP); Masaki Kusano, Tokyo (JP); Daisuke Matsuura, Tokyo (JP); Daisuke Kobayashi, Tokyo (JP); Kazuyuki Hirose, Tokyo (JP); Osamu Kawasaki, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 17/057,428

(22) PCT Filed: Oct. 11, 2019

(86) PCT No.: PCT/JP2019/040152
§ 371 (c)(1),
(2) Date: Nov. 20, 2020

(87) PCT Pub. No.: WO2020/080272
PCT Pub. Date: Apr. 23, 2020

(65) Prior Publication Data
US 2021/0210135 A1 Jul. 8, 2021

(30) Foreign Application Priority Data
Oct. 19, 2018 (JP) .............................. JP2018-197684

(51) Int. Cl.
*G11C 11/417* (2006.01)
*G11C 29/50* (2006.01)

(52) U.S. Cl.
CPC ...... *G11C 11/417* (2013.01); *G11C 29/50004* (2013.01); *G11C 2029/5004* (2013.01)

(58) Field of Classification Search
CPC .................................................. G11C 11/417
(Continued)

(56) References Cited

U.S. PATENT DOCUMENTS

| | | | | |
|---|---|---|---|---|
| 6,125,052 A * | 9/2000 | Tanaka | ................ | G11C 11/5621 365/185.03 |
| 6,219,273 B1 * | 4/2001 | Katti | ...................... | G11C 11/15 365/158 |

(Continued)

FOREIGN PATENT DOCUMENTS

| | | |
|---|---|---|
| JP | 2017-27637 | 2/2017 |
| JP | 2018-152429 | 9/2018 |

OTHER PUBLICATIONS

Daisuke Kob Ayashi et al., "Process Variation Aware Analysis of SRAM SEU Cross-Sections Using Data Retention Voltage", IEEE Transactions on Nuclear Science, Jul. 2018, pp. 1-7.*

(Continued)

*Primary Examiner* — Muna A Techane
(74) *Attorney, Agent, or Firm* — Wenderoth, Lind & Ponack, L.L.P.

(57) ABSTRACT

The purpose of the invention is to compensate for the radiation tolerance of a semiconductor memory. An apparatus (10) for compensating for radiation tolerance comprises: a voltage value acquisition unit (11) that acquires a data retention voltage value that is a maximum voltage value at which data is inverted when a power supply voltage of a semiconductor memory having a latch circuit is lowered; a correction value determination unit (12) that determines a voltage correction value on the basis of a difference between the data retention voltage value and a reference voltage value; and a voltage adjustment unit (13) that adjusts at least one among the power supply voltage and a substrate bias voltage by using the voltage correction value. The reference voltage value is set to be equal to or lower than the data retention voltage value that satisfies a required radiation tolerance.

7 Claims, 5 Drawing Sheets

(58) Field of Classification Search
USPC .......................................................... 365/154
See application file for complete search history.

(56) References Cited

U.S. PATENT DOCUMENTS

| | | | | |
|---|---|---|---|---|
| 2002/0163844 | A1* | 11/2002 | Kurjanowicz | G11C 11/4099 365/210.1 |
| 2007/0211527 | A1* | 9/2007 | Hsu | G11C 11/4125 365/185.02 |
| 2008/0012047 | A1* | 1/2008 | Bertin | G11C 17/165 257/213 |
| 2009/0073782 | A1 | 3/2009 | Hanafi et al. | |
| 2010/0135093 | A1 | 6/2010 | Kuo et al. | |
| 2011/0128035 | A1 | 6/2011 | Turner et al. | |
| 2016/0111146 | A1 | 4/2016 | Pan et al. | |
| 2017/0178720 | A1 | 6/2017 | Pan et al. | |
| 2020/0007124 | A1 | 1/2020 | Matsuura et al. | |

OTHER PUBLICATIONS

International Search Report dated Dec. 24, 2019 in corresponding International Application No. PCT/JP2019/040152.
Extended European Search Report dated Jun. 2, 2021 in corresponding European Application No. 19874329.6.

* cited by examiner

APPARATUS FOR COMPENSATING FOR RADIATION RESISTANCE OF SEMICONDUCTOR MEMORY, METHOD THEREFOR, AND ELECTRONIC CIRCUIT

TECHNICAL FIELD

The present invention relates to an apparatus for compensating for radiation tolerance of a semiconductor memory, a method therefor, and an electronic circuit.

In the related art, there is known that radiation, such as high-energy cosmic rays or neutron rays, is incident on a semiconductor memory to cause a logic inversion phenomenon (Single Event Upset (SEU)) of retained data (for example, see PTL 1). The logic inversion phenomenon leads to an erroneous operation (soft error) of a computer that uses the semiconductor memory. Accordingly, there is a need to perform a radiation tolerance inspection that excludes a semiconductor memory of which radiation tolerance does not satisfy a given reference.

The radiation tolerance inspection of the semiconductor memory is a destructive inspection that is performed by making radiation of predetermined intensity incident on the semiconductor memory. Accordingly, it is not possible to perform an inspection on all semiconductor memories. For this reason, at present, a predetermined number of representative semiconductor memories from among a plurality of semiconductor memories manufacturing in the same design are selected, and the radiation tolerance inspection is performed on the selected semiconductor memories.

CITATION LIST

Patent Literature

[PTL 1] Japanese Unexamined Patent Application Publication No. 2018-152429

SUMMARY OF INVENTION

Technical Problem

In recent years, with miniaturization of transistors used in a semiconductor memory, variation in characteristic among the transistors becomes large, and accordingly, variation in radiation tolerance between chips of the semiconductor memory becomes large.

For this reason, for example, even though a representative semiconductor memory subjected to an unannounced inspection in the radiation tolerance inspection satisfies a reference of radiation tolerance, there is a concern that a semiconductor memory not satisfying the reference of radiation tolerance is included in a group of products.

The invention has been accomplished in view of such a situation, and an object of the invention is to provide an apparatus for compensating for radiation tolerance of a semiconductor memory, a method therefor, and an electronic circuit capable of compensating for radiation tolerance of a semiconductor memory.

Solution to Problem

A first aspect of the invention is an apparatus for compensating for radiation tolerance of a semiconductor memory including a voltage value acquisition unit that acquires, when a power supply voltage of the semiconductor memory having a latch circuit is lowered, a maximum voltage value of the supply power voltage at which data is inverted, as a data retention voltage value a correction value determination unit that determines a voltage correction value based on a difference between the data retention voltage value and a reference voltage value, and a voltage adjustment unit that adjusts at least one of the power supply voltage and a substrate bias voltage using the voltage correction value. The reference voltage value is set to be equal to or lower than the data retention voltage value of a semiconductor memory that satisfies required radiation tolerance.

With the apparatus for compensating for radiation tolerance of a semiconductor memory, the data retention voltage value of the semiconductor memory is acquired by the voltage value acquisition unit, and the voltage correction value is determined by the correction value determination unit based on the difference between the acquired data retention voltage value and the reference voltage value. Then, at least one of the power supply voltage of the semiconductor memory or the substrate bias voltage is adjusted using the voltage correction value determined in this way. In this case, the reference voltage value is set to be equal to or lower than the data retention voltage value of the semiconductor memory that satisfies the required radiation tolerance. With this, it is possible to maintain the voltage difference between the power supply voltage and the data retention voltage of the semiconductor memory to be compensated to be equal to or higher than a voltage difference corresponding to the required radiation tolerance. As a result, it is possible to keep the radiation tolerance to be equal to or higher than a required reference.

In the apparatus for compensating for radiation tolerance of a semiconductor memory, the voltage value acquisition unit may acquire the data retention voltage value for each of a plurality of the semiconductor memories, the correction value determination unit may determine the voltage correction value for each semiconductor memory based on a difference between the data retention voltage value acquired for each semiconductor memory and the reference voltage value that is a common value among the semiconductor memories, and the voltage adjustment unit may adjust at least one of the power supply voltage of the semiconductor memory and the substrate bias voltage using the voltage correction value determined for each semiconductor memory.

With the apparatus for compensating for radiation tolerance of a semiconductor memory, the voltage correction value of each semiconductor memory is determined using the common reference voltage value among a plurality of semiconductor memories, and at least one of the power supply voltage of each semiconductor memory and the substrate bias voltage is adjusted using the determined voltage correction value. With this, it is possible to make the radiation tolerance of each semiconductor memory a substantially equivalent value, and to suppress variation in radiation tolerance among the semiconductor memories.

In the apparatus for compensating for radiation tolerance of a semiconductor memory, the semiconductor memory may be mounted with a plurality of the latch circuits, the voltage value acquisition unit may acquire data retention voltage values of a part or all of the plurality of the latch circuits, the correction value determination unit may calculate a feature value of the data retention voltage values by statistically processing a plurality of the data retention voltage values acquired by the voltage value acquisition unit and may determine the voltage correction value based on a difference between the calculated feature value of the data retention voltage values and the reference voltage value.

With the apparatus for compensating for radiation tolerance of the semiconductor memory, the data retention voltage values of a part or all of the plurality of latch circuits mounted in the semiconductor memory, and the voltage correction value is calculated using the feature value statistically acquired from the plurality of acquired data retention voltage values. Accordingly, it is possible to obtain the voltage correction value using the data retention voltage value in which the characteristic of the semiconductor memory is more reflected. With this, it is possible to improve compensation accuracy compared to a case where the data retention voltage value for one latch circuit is used.

A second aspect of the invention is an electronic circuit including a semiconductor memory and the apparatus for compensating for radiation tolerance of a semiconductor memory.

A third aspect of the invention is a method for compensating for radiation tolerance of a semiconductor memory. The method includes a voltage value acquisition step of acquiring, when a power supply voltage of the semiconductor memory having a latch circuit is lowered a maximum voltage value of the power supply voltage at which data is inverted, as a data retention voltage value, a correction value determination step of determining a voltage correction value based on a difference between the data retention voltage value and a reference voltage value, and a voltage adjustment step of adjusting at least one of the power supply voltage and a substrate bias voltage using the voltage correction value. The reference voltage value is set to be equal to or lower than the data retention voltage value of the semiconductor memory that satisfies required radiation tolerance.

In the method for compensating for radiation tolerance of a semiconductor memory, in the voltage value acquisition step, the data retention voltage value may be acquired for each of a plurality of the semiconductor memories, in the correction value determination step, the voltage correction value may be determined for each semiconductor memory based on a difference between the data retention voltage value acquired for each semiconductor memory and the reference voltage value that is a common value among the semiconductor memories, and in the voltage adjustment step, at least one of the power supply voltage of each semiconductor memory and the substrate bias voltage may be adjusted using the voltage correction value determined for each semiconductor memory.

In the method for compensating for radiation tolerance of a semiconductor memory, the semiconductor memory may be mounted with a plurality of the latch circuits, in the voltage value acquisition step, data retention voltage values of a part or all of the plurality of the latch circuits may be acquired, and in the correction value determination step, a feature value of the data retention voltage values may be calculated by statistically processing a plurality of the data retention voltage values acquired in the voltage value acquisition step and the voltage correction value may be determined based on a difference between the calculated feature value of the data retention voltage values and the reference voltage value.

Advantageous Effects of Invention

According to the disclosure of the invention, an effect of compensating for radiation tolerance of a semiconductor memory is achieved.

DESCRIPTION OF EMBODIMENTS

Figure 1:
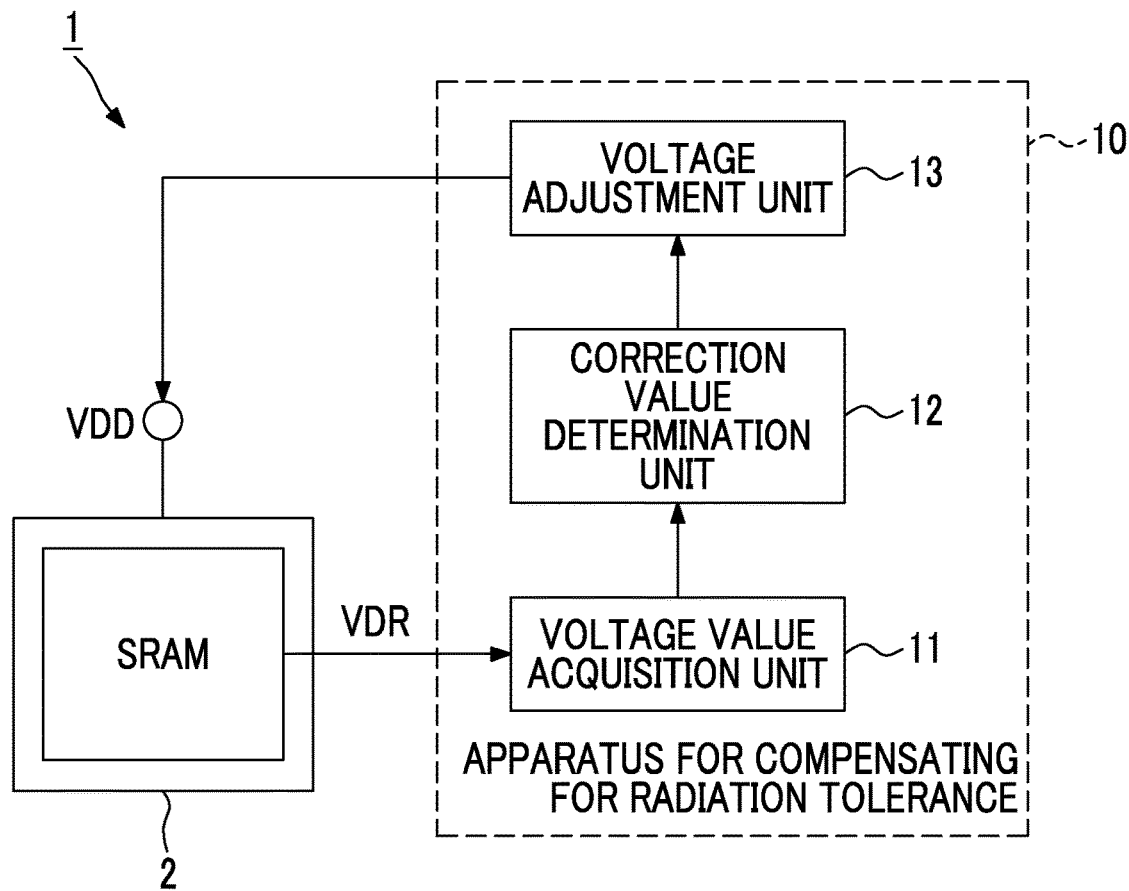
FIG. 1 is a schematic configuration diagram showing the schematic configuration of an electronic circuit according to an embodiment of the invention.

Hereinafter, an apparatus for compensating for radiation tolerance of a semiconductor memory, a method therefor, and an electronic circuit according to an embodiment of the invention will be described referring to the drawings.

FIG. 1 is a diagram showing the schematic configuration of an electronic circuit 1 according to an embodiment of the invention. As shown in FIG. 1, the electronic circuit 1 according to the embodiment includes a static RAM (SRAM) 2 and an apparatus 10 for compensating for radiation tolerance that compensates for radiation tolerance of the SRAM 2.

Figure 2:
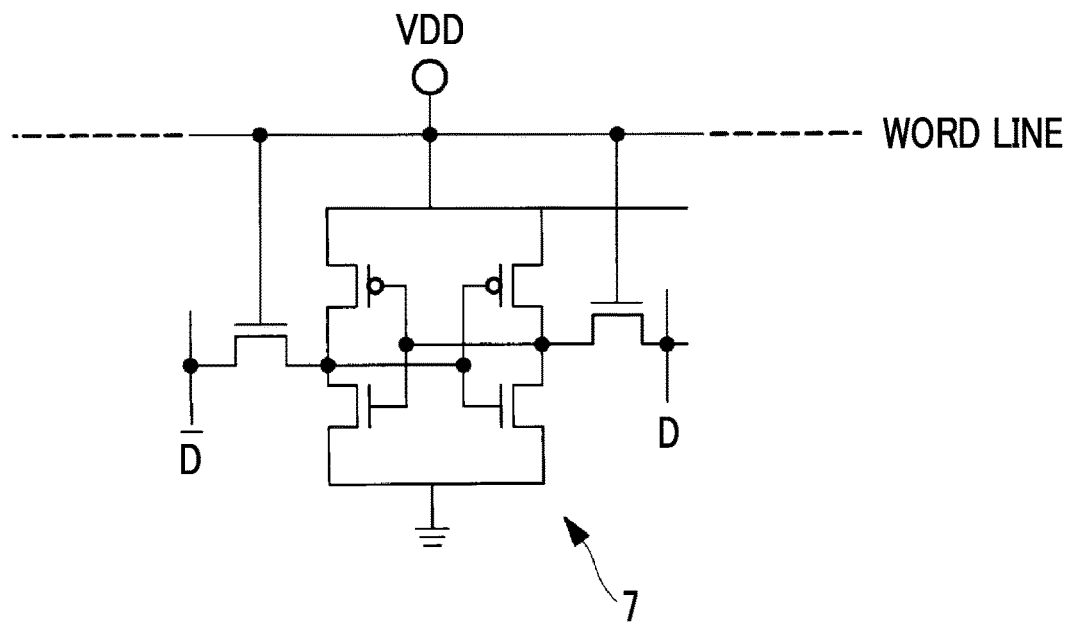
FIG. 2 is a diagram showing a configuration example of a memory cell in an SRAM according to an embodiment of the invention.

The SRAM 2 is a RAM in which a memory cell 7 (see FIG. 2) is constituted of a latch circuit. FIG. 2 is a diagram showing a configuration example of a memory cell 7. Inside the SRAM 2, for example, as shown in FIG. 2, a plurality of one-bit memory cells 7 constituted of four to six transistors (for example, MOS type FET) are arranged. The internal configuration of the SRAM 2 is known, and thus, detailed description thereof will not be repeated.

The apparatus 10 for compensating for radiation tolerance is an apparatus that compensates for radiation tolerance of the SRAM 2, and has, as a main configuration, a voltage value acquisition unit 11, a correction value determination unit 12, and a voltage adjustment unit 13.

The voltage value acquisition unit 11 acquires a data retention voltage value VDR that is a maximum voltage, at which data retained in the memory cell 7 is inverted when the power supply voltage VDD is lowered in the SRAM 2.

In other words, the data retention voltage value VDR means a minimum voltage value at which the memory cell 7 can retain bit information.

Hereinafter, an example of a procedure of an acquisition method of the data retention voltage value VDR in the voltage value acquisition unit 11 will be described referring to FIG. 3.

First, the voltage value acquisition unit 11 sets a normal operation voltage (for example, 1.2 V) as a previous value Vset(i−1) and sets, as a present value Vset(i), a voltage value (Vset(i−1)−ΔVu) lower than the previous value by a predetermined voltage value ΔVu (S1). Here, the predetermined voltage value ΔVu can be set discretionarily, and as an example, 10 mV is exemplified. For example, in a case where the predetermined voltage value ΔVu is 10 mV, 1.19 V is set as the present value Vset(i).

Subsequently, the normal operation voltage (for example, 1.2 V) is applied to the power supply voltage VDD, and an initial value (for example, all "1" or all "0") is written to all memory cells 7 of the SRAM 2 (S2).

Next, the power supply voltage VDD is lowered to the present value Vset(i), this state is maintained for a predetermined time (S3), and thereafter, the power supply voltage VDD is returned to the normal operation voltage (S4).

Next, data of the SRAM 2 is read, and determination is made whether or not data is inverted from the initial value (S5). In a case where the read data is inverted from the initial value, the previous value Vset(i−1) is acquired as the data retention voltage value VDR of the memory cell 7 (S6).

Subsequently, the present value Vset(i) is set as the previous value Vset(i−1), and a voltage value (Vset(i−1)−ΔVu) lower than the previous value by the predetermined voltage value is set as the present value Vset(i) (S7). With this, for example, "1.19 V" is set as the previous value Vset(i−1), and "1.18 V" is set as the present value Vset(i).

Subsequently, determination is made whether or not the previous value Vset(i−1) is a final voltage value (for example, 0 V) (S8).

As a result, when the previous value is not the final voltage value (S8: NO), the process returns to Step S3, and the above-described processing is repeatedly executed. With this, the previous value and the present value are updated in units of the predetermined voltage value ΔVu (for example, 10 mV), and every time this happens, the previous value Vset(i−1) set at that time is acquired as the data retention voltage value VDR of the memory cell where data inversion occurs. In regards to the memory cells where the data retention voltage value VDR is already acquired, the data retention voltage value VDR is not updated and the initially acquired value is kept.

Then, Steps S3 to S7 described above are repeatedly executed, and when determination is made in Step S8 that the previous value Vset(i−1) is the final voltage value (S8: YES), the processing ends. The final voltage value determines a minimum value of the data retention voltage value VDR, and is a value that can be set discretionarily.

With the execution of the above-described processing, in each memory cell, a maximum voltage value of the power supply voltage VDD when data is inverted can be obtained as the data retention voltage value VDR.

In the above-described example, although the process returns to Step S3 in a case where negative determination is made in Step S8, alternatively, for example, the process may return to Step S2, the normal operation voltage may be applied to the power supply voltage every time, and the initial value may be written to all cells.

Figure 3:
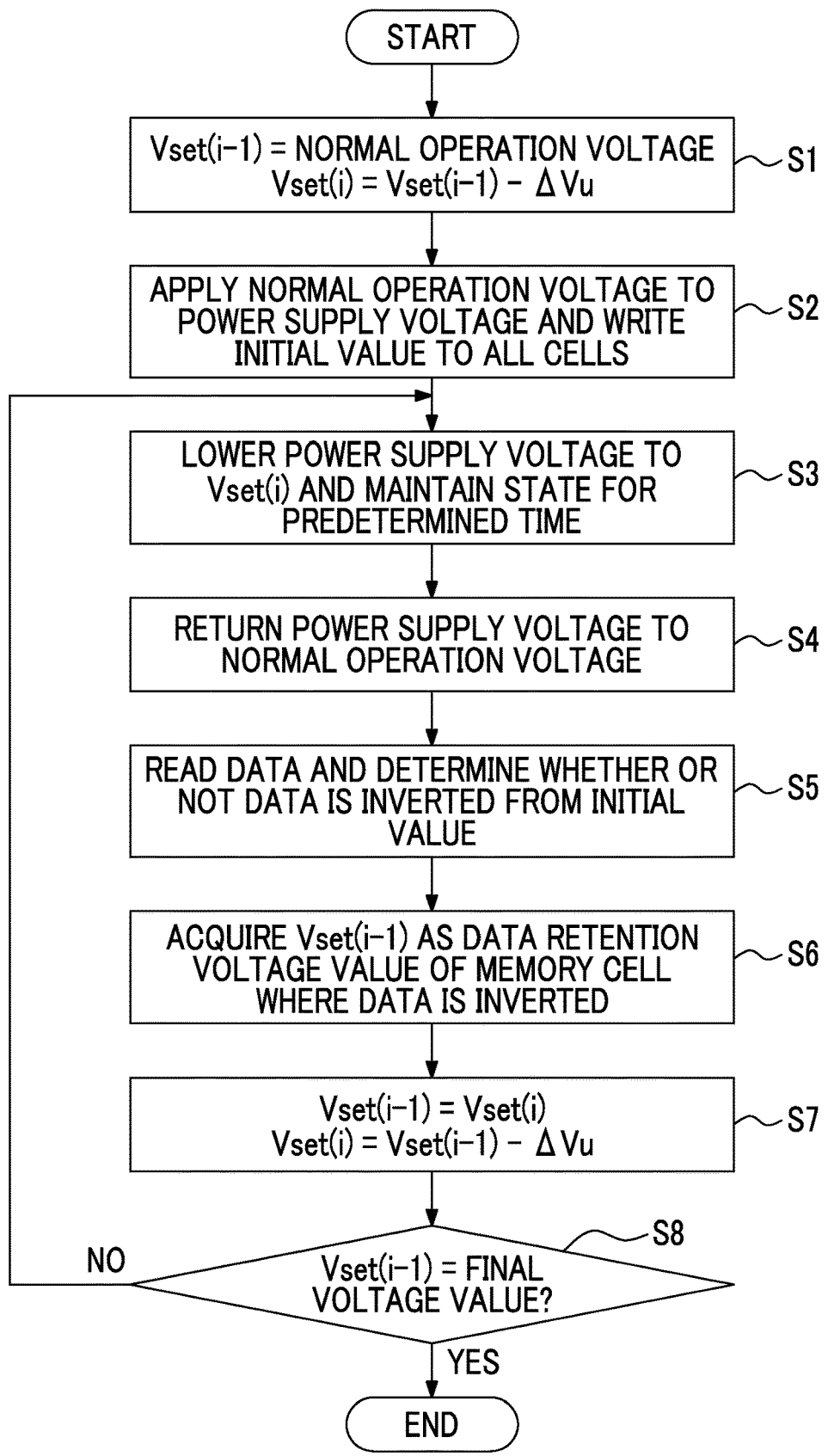
FIG. 3 is a flowchart of a procedure of an acquisition method of a data retention voltage according to an embodiment of the invention.

As a specific configuration example of the voltage value acquisition unit 11, for example, a programmable power supply that has a voltage control program for changing the power supply voltage VDD with a determined voltage range and a determined speed order in compliance with a processing procedure shown in FIG. 3 (for example, decreasing the power supply voltage VDD within a voltage range of 1.2 V to 0 V in units of 10 mV in increments of one second) and changes the power supply voltage VDD by executing the voltage control program is exemplified. Then, an inversion state of output data of the memory cell 7 is monitored each time the power supply voltage VDD is changed, and when there is a memory cell where retained data is inverted, a current value of the power supply voltage VDD is acquired as the data retention voltage value VDR of the memory cell 7. The voltage value acquisition unit 11 also has a storage device (not shown) that stores the data retention voltage value VDR of the memory cell 7.

The voltage value acquisition unit 11 may acquire the data retention voltage value VDR for all memory cells 7 provided in the SRAM 2 or may acquire the data retention voltage value VDR of one representative memory cell 7 or a part of representative memory cells 7 among a plurality of memory cells 7 provided in the SRAM 2.

The correction value determination unit 12 determines a voltage correction value based on a difference between the data retention voltage value VDR acquired by the voltage value acquisition unit 11 and a reference voltage value VDR(0). Here, in a case where the data retention voltage value VDR of one representative memory cell 7 is acquired by the voltage value acquisition unit 11, the voltage correction value is determined using the data retention voltage value VDR. On the other hand, in a case where the data retention voltage values VDR of a plurality of memory cells 7 are acquired by the voltage value acquisition unit 11, the correction value determination unit 12 calculates a feature value of the data retention voltage values by statistically processing the data retention voltage values VDR and determines the voltage correction value using the calculated feature value of the data retention voltage value. As an example of the feature value, for example, an average value, a maximum value, a minimum value, or the like is exemplified. The invention is not limited to this example, and for example, a feature value may be calculated by other statistical methods, such as a normal distribution.

The correction value determination unit 12 determines the voltage correction value from a difference ΔV between the data retention voltage value VDR and the reference voltage value VDR(0) described above. For example, the correction value determination unit 12 has an arithmetic expression, a table, or the like in which the difference ΔV and the voltage correction value are associated with each other in advance, and obtains the voltage correction value corresponding to the difference ΔV using the information. Information (arithmetic expression, table, or the like) in which the difference ΔV and the voltage correction value are associated with each other can be derived, for example, from a relationship of the data retention voltage value VDR, the power supply voltage VDD, and an error cross-sectional area XS (for example, see FIGS. 5 to 8) described below.

Here, in a case where the data retention voltage value VDR is equal to or higher than the reference voltage value VDR(0), the correction value determination unit 12 sets the voltage correction value to zero. For example, in the table or the arithmetic expression that is referred to by the correction value determination unit 12, zero is set in a region where the data retention voltage value VDR is equal to or higher than the reference voltage value VDR(0). In this case, the adjustment of the power supply voltage value may not always be performed.

As the reference voltage value VDR(0), for example, a voltage value set in advance can be used. For example, in regard to the reference voltage value VDR(0), an SRAM that satisfies a required reference value of radiation tolerance (for example, SEU tolerance), in other words, an SRAM in which radiation tolerance is assured may be prepared in advance, the data retention voltage value may be acquired from the SRAM in advance, and the acquired data retention voltage value or a voltage value lower than the data retention voltage value by a predetermined voltage value (for example, several mV) may be set as the reference voltage value VDR(0).

The correction value determination unit 12 is realized by, for example, a computer including a CPU, a main storage device, an auxiliary storage device, and the like. For example, a program for realizing the above-described function is stored in the auxiliary storage device, and the CPU reads the program from the auxiliary storage device onto the main storage device to process information and execute arithmetic processing, whereby the above-described function is realized.

The voltage adjustment unit 13 has the voltage correction value determined by the correction value determination unit 12 in a predetermined storage area, and adjusts the power supply voltage VDD of the SRAM 2 using the voltage correction value. The voltage adjustment unit 13 applies, for example, a value obtained by adding the voltage correction value to a specification standard value (for example, 1.2 V) of the power supply voltage VDD to the power supply voltage VDD.

In a configuration in which a voltage applied to the power supply voltage VDD is changed, for example, a method that uses a variable voltage regulator, or the like is exemplified as an example.

Figure 4:
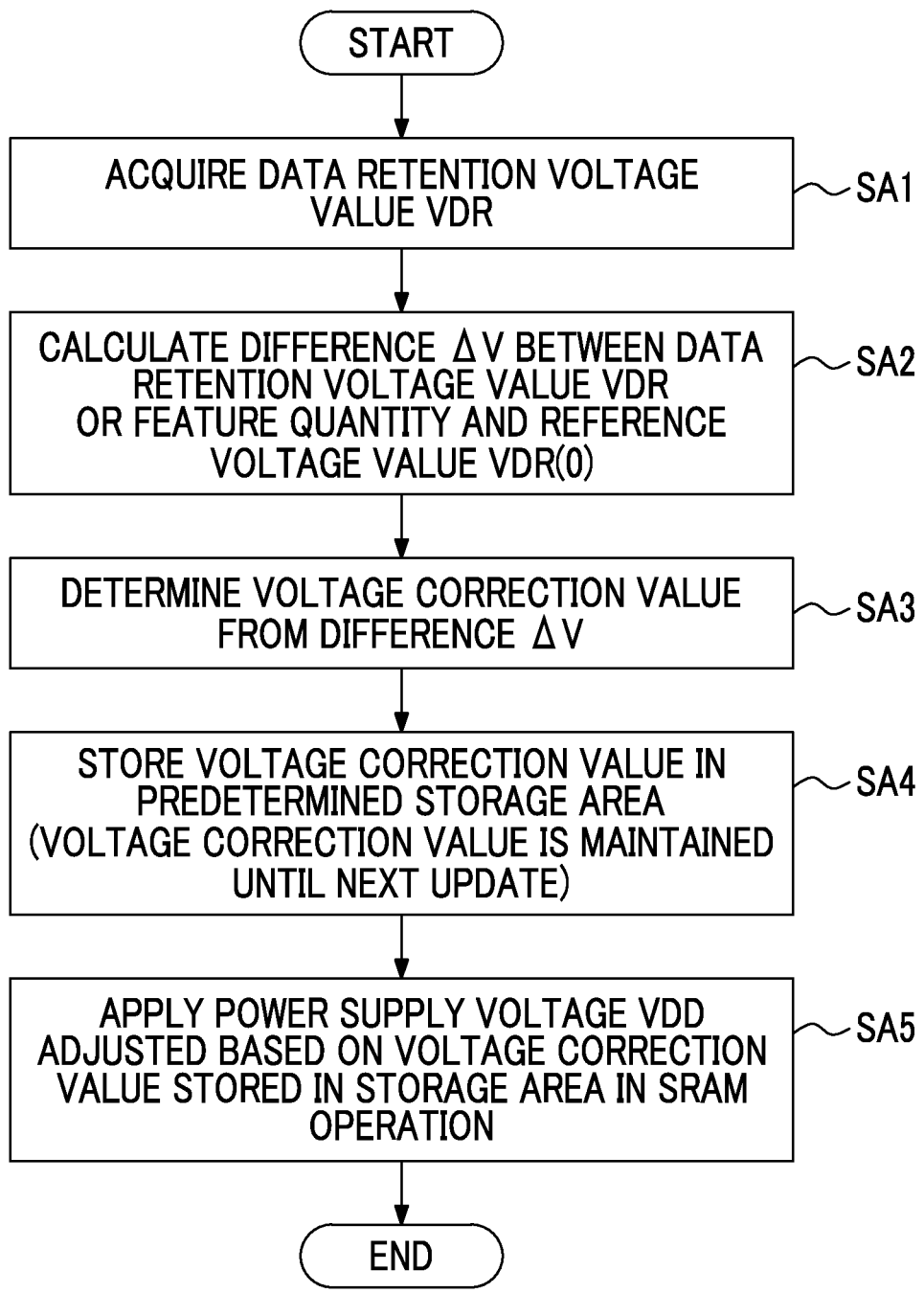
FIG. 4 is a flowchart showing an example of a procedure of a method for compensating for radiation tolerance according to an embodiment of the invention.

Next, a method for compensating for radiation tolerance according to an embodiment of the invention will be simply described referring to FIG. 4. FIG. 4 is a flowchart showing a procedure of a method for compensating for radiation tolerance according to the embodiment. Detailed contents in the respective steps are as described above, and thus, description thereof will not be repeated.

First, in the SRAM 2, the data retention voltage value VDR for one or a plurality of memory cells 7 is acquired (SA1). Subsequently, the difference ΔV between the acquired data retention voltage value VDR or the feature value of the data retention voltage value VDR and the reference voltage value VDR(0) set in advance is calculated (SA2). Next, a voltage correction value is determined based on the calculated difference ΔV (SA3), and the determined voltage correction value is stored in a predetermined storage area (SA4). Here, the voltage correction value stored in the storage area is maintained until a new voltage correction value is determined next time.

Subsequently, in the operation of the SRAM 2, the power supply voltage VDD adjusted based on the voltage correction value stored in the storage area is applied (SA5). That is, a voltage of a voltage value adjusted by the voltage correction value obtained this time is applied to a power supply voltage terminal of the SRAM 2 until a new voltage correction value is determined next time.

Update of the above-described voltage correction value may be performed at predetermined time intervals. That is, the characteristic of radiation tolerance in the SRAM 2 is deteriorated with a lapse of time or according to an incident dose of radiation. Accordingly, a voltage correction value is determined at an appropriate timing according to change in radiation tolerance again, whereby it is possible to compensate for radiation tolerance with the lapse of time.

As described above, with the apparatus 10 for compensating for radiation tolerance of a semiconductor memory, the method therefor, and the electronic circuit 1 according to the above-described embodiment, the data retention voltage value VDR of the SRAM 2 is acquired, the voltage correction value according to the difference between the acquired data retention voltage value VDR and the reference voltage value VDR(0) is determined, and the determined voltage correction value is reflected in the power supply voltage VDD. In this case, the reference voltage value VDR(0) is set in advance to a value equal to or lower than the data retention voltage value VDR of the SRAM that satisfies a required reference of radiation tolerance. Accordingly, it is possible to keep the radiation tolerance of the SRAM 2 to be equal to or higher than the required reference.

Hereinafter, the ground on which the radiation tolerance equal to or higher than the required reference can be secured by adjusting the power supply voltage VDD using the voltage correction value as described above will be described in detail.

Figure 5:
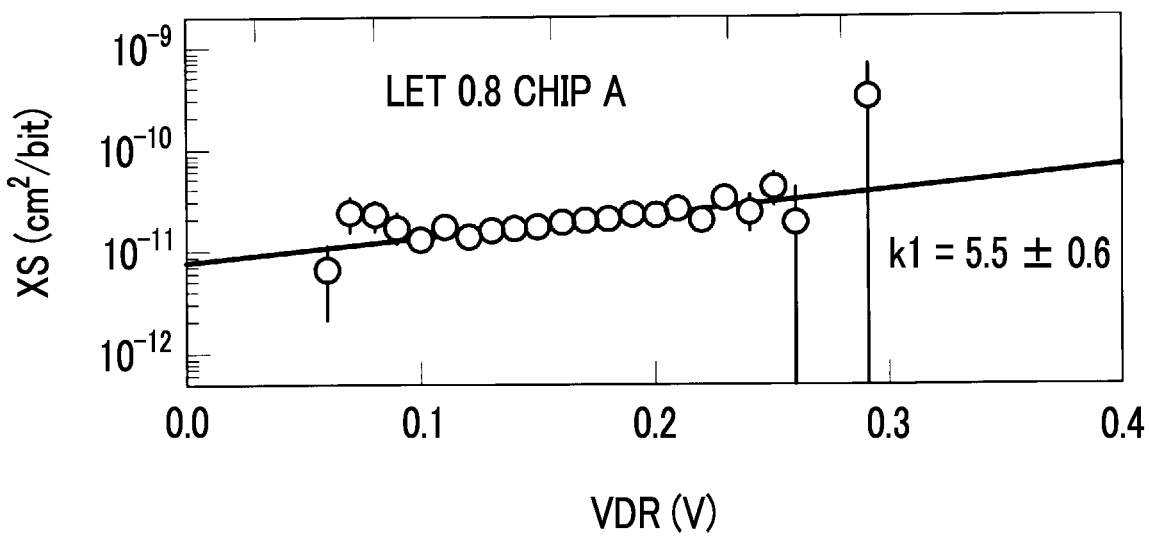
FIG. 5 is a diagram showing an example of a relationship between a data retention voltage value and an error cross-sectional area when a power supply voltage is fixed to 0.75 V, and a radiation dose of predetermined intensity is incident on a chip A as a specimen.
Figure 6:
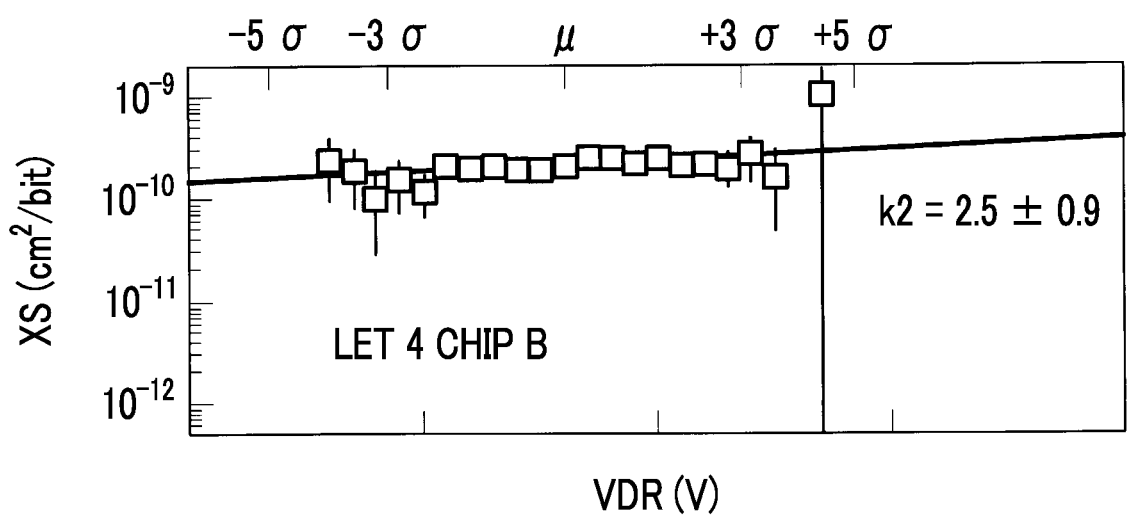
FIG. 6 is a diagram showing an example of a relationship between a data retention voltage value and an error cross-sectional area when the power supply voltage is fixed to 0.75 V, and a radiation dose of different intensity from the chip A is incident on a chip B as a specimen.

First, the inventors have found that the data retention voltage value VDR of the SRAM and the error cross-sectional area XS are correlated with each other. FIGS. 5 and 6 are diagrams showing an example of a relationship between the data retention voltage value VDR and the error cross-sectional area XS when the power supply voltage VDD is fixed to 0.75 V, and radiation of different intensity (LET(MeV·cm$^2$/mg)) is incident on a chip A and a chip B as two specimens with a given dose. As shown in FIGS. 5 and 6, in both cases, the smaller the data retention voltage value VDR, the smaller the value of the error cross-sectional area XS, the characteristic of the data retention voltage value VDR and the error cross-sectional area XS shows a linear characteristic in a semi-logarithmic plot, and it is understood that both of the characteristic of the data retention voltage value VDR and the error cross-sectional area XS show an exponential relationship.

Here, the error cross-sectional area XS is a parameter represented by Expression (1) described below. The smaller the value of the error cross-sectional area XS, the higher the radiation tolerance.

$$XS \text{ (cm}^2\text{/bit)} = N/(f \cdot M) \qquad (1)$$

Figure 7:
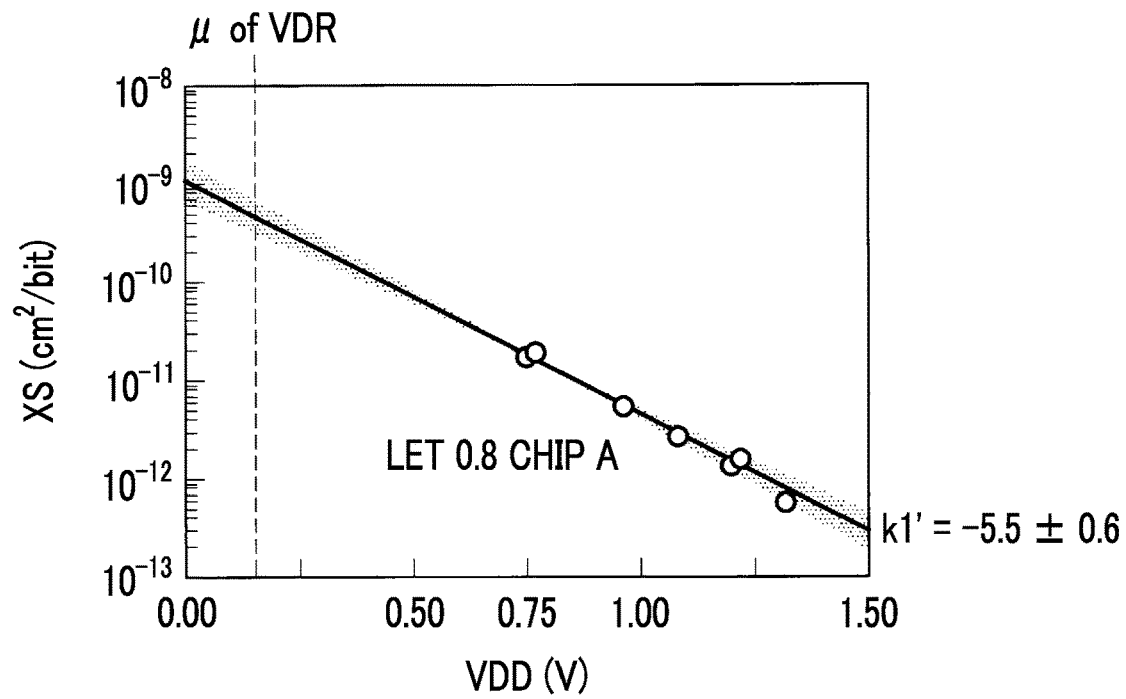
FIG. 7 is a diagram showing an example of a relationship between a power supply voltage and an error cross-sectional area when a radiation dose of the same intensity as FIG. 5 is incident on the chip A as a specimen while changing the power supply voltage between 1.5 V to 0.75 V.
Figure 8:
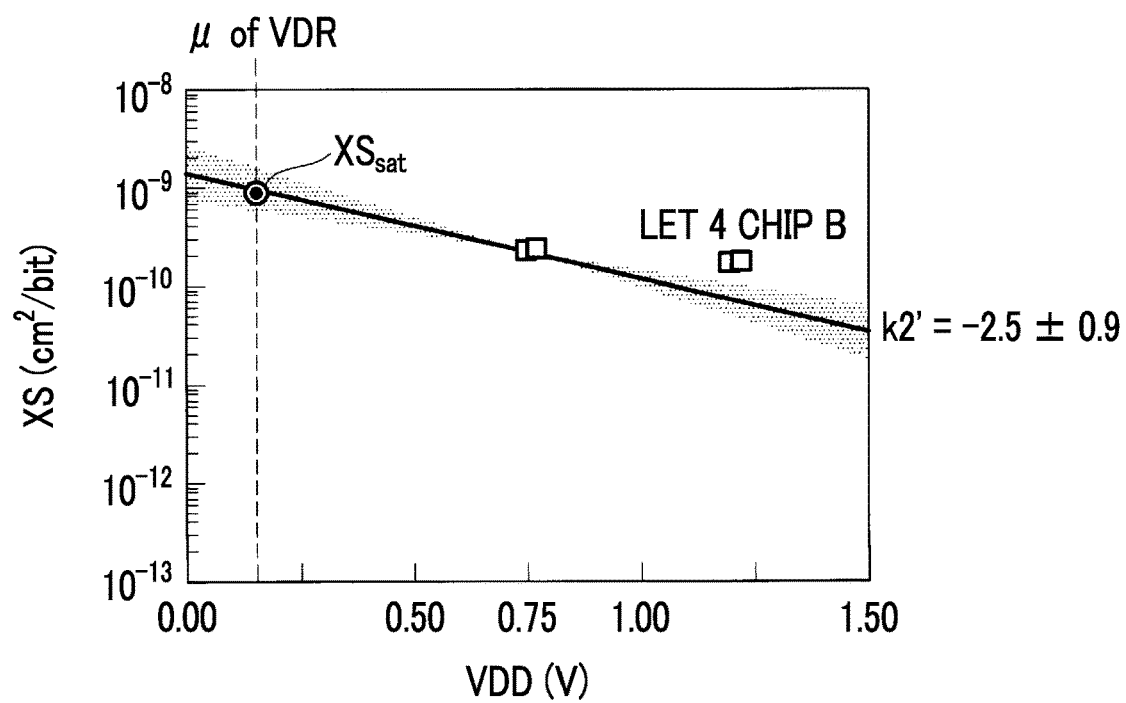
FIG. 8 is a diagram showing an example of a relationship between a power supply voltage and an error cross-sectional area when a radiation dose of the same intensity as FIG. 6 is incident on the chip B as a specimen while changing the power supply voltage between 1.5 V to 0.75 V.

M: the number of memory cells having a certain data retention voltage value VDR among the memory cells of the SRAM f: an incident radiation dose (cm$^{-2}$) per unit area N: the number of cells where bit inversion occurs among M memory cells when irradiation is performed with the radiation dose defined by f There is also a correlation between the power supply voltage VDD and the error cross-sectional area XS. FIGS. 7 and 8 are diagrams showing an example of a test result by the inventors, FIG. 7 is a diagram showing an example of a relationship between the power supply voltage VDD and the error cross-sectional area XS when a radiation dose of the same intensity as FIG. 5 is incident on the chip A as a specimen while changing the power supply voltage VDD between 1.5 V to 0.75 V, and FIG. 8 is a diagram showing an example of a relationship between the power supply voltage VDD and the error cross-sectional area XS when a radiation dose of the same intensity as FIG. 6 is incident on the chip B as a specimen while changing the power supply voltage VDD between 1.5 V to 0.75 V. As shown in FIGS. 7 and 8, in both specimens (chip A and chip B), the greater the power supply voltage VDD, the smaller the error cross-sectional area XS, the characteristic of the power supply voltage VDD and the error cross-sectional area XS is a linear characteristic in a semi-logarithmic plot, and it is understood that both of the power supply voltage VDD and the error cross-sectional area XS show an exponential relationship.

Then, from the above-described result, the inventors have found that, when a slop indicated by the characteristic of FIG. 5 is "k1", a slop indicated by the characteristic of FIG. 7 is "−k1", and when a slop indicated by the characteristic of FIG. 6 is "k2", a slop indicated by the characteristic of FIG. 8 is "−k2". From this, it has been found that the error cross-sectional area XS can be represented by Expression (2) described below, and depends on a voltage difference (VDD-VDR) between the power supply voltage VDD and the data retention voltage value VDR.

$$XS = A \exp\{-k(VDD-VDR)\} \quad (2)$$

Based on the above-described new knowledge, it is understood that, when the voltage difference between the power supply voltage VDD and the data retention voltage value VDR can be maintained at an appropriate value, the error cross-sectional area XS can be kept to be equal to or less than a given value. From this, like the apparatus 10 for compensating for radiation tolerance according to the embodiment described above, the reference voltage value VDR(0) is set in advance according to the data retention voltage value obtained from the SRAM satisfying the required reference of the radiation tolerance, and the power supply voltage VDD is adjusted using the voltage correction value according to the difference between the data retention voltage value VDR of the SRAM 2 and the reference voltage value VDR(0), whereby it is possible to maintain the voltage difference between the power supply voltage VDD and the data retention voltage value VDR to be equal to or higher than a voltage difference corresponding to the required reference of the radiation tolerance. With this, even though the SRAM 2 does not satisfy the required reference of the radiation tolerance in a state in which the power supply voltage VDD is not corrected, the power supply voltage VDD is adjusted as described above, whereby it is possible to compensate for the radiation tolerance so as to satisfy the required reference.

In addition, the power supply voltage VDD of each SRAM 2 is adjusted using the common reference voltage value VDR(0) among a plurality of SRAMs 2, whereby it is possible to make the voltage difference between the power supply voltage VDD and the data retention voltage value VDR of each SRAM 2 a substantially equivalent value among a plurality of SRAMs. With this, it is possible to make the error cross-sectional area XS among the SRAMs 2 (among the chips) substantially uniform, and consequently, to suppress variation in radiation tolerance among the SRAMs.

It is possible to change the data retention voltage value VDR of each memory cell 7 uniformly by changing a substrate bias voltage in the SRAM 2. Accordingly, instead of the above-described power supply voltage VDD, the value of the substrate bias voltage may be adjusted. In this case, the correction value determination unit has information (for example, an arithmetic expression or a table) in which the difference ΔV and the substrate bias voltage are associated with each other, and a voltage correction value of the substrate bias voltage is acquired from the difference ΔV using the information. In this way, it is possible to compensate for the radiation tolerance or to suppress variation in radiation tolerance among the chips even by adjusting the value of the substrate bias voltage.

In addition, instead of the above-described example, the voltage adjustment unit may correct both of the power supply voltage VDD of the SRAM 2 and the substrate bias voltage.

Although the invention has been described above in connection with the embodiment, the technical scope of the invention is not limited to the scope described in the above-described embodiment. Various alterations or improvements can be made to the above-described embodiment without departing from the spirit and scope of the invention, and any forms resulting from such alterations or improvements still fall within the technical scope of the invention. The above-described embodiment may be appropriately combined.

For example, in the above-described embodiment, although the SRAM 2 has been described as a specific example of a semiconductor memory having a latch structure, the semiconductor memory of the invention is not limited to this example, and may be a semiconductor memory having at least one latch circuit. As an example, the semiconductor memory, a flip-flop circuit, a latch circuit, or the like is exemplified.

Although a value acquired from an SRAM having desired radiation tolerance in advance has been used as the reference voltage value VDR(0), alternatively, for example, another SRAM that satisfies the required reference of the radiation tolerance is disposed in a shielded space such that deterioration due to radiation is prevented under the same environment (for example, on the satellite orbit of the universe) as the SRAM 2, a data retention voltage value of another SRAM may be acquired in real time under this situation, and the data retention voltage value may be set as a reference voltage at any time.

REFERENCE SIGNS LIST

1: electronic circuit
7: memory cell
10: apparatus for compensating for radiation tolerance
11: voltage value acquisition unit
12: correction value determination unit
13: voltage adjustment unit

The invention claimed is:

1. An apparatus for compensating for radiation tolerance of a semiconductor memory having a latch circuit, the apparatus comprising:
    a voltage value acquisition unit that acquires a data retention voltage value, the data retention voltage value corresponding to a maximum voltage value at which data is inverted, when a power supply voltage of the semiconductor memory is lowered;
    a correction value determination unit that determines a voltage correction value based on a difference between the data retention voltage value and a reference voltage value; and
    a voltage adjustment unit that adjusts at least one of the power supply voltage and a substrate bias voltage using the voltage correction value,
    wherein the reference voltage value is set to be equal to or lower than the data retention voltage value of a semiconductor memory that satisfies required radiation tolerance.

2. The apparatus for compensating for radiation tolerance of a semiconductor memory according to claim 1, wherein the voltage value acquisition unit acquires the data retention voltage value for each of a plurality of the semiconductor memories, the correction value determination unit determines the voltage correction value for each semiconductor memory based on a difference between the data retention voltage value acquired for each semiconductor memory and the reference voltage value that is a common value among the semiconductor memories, and the voltage adjustment unit adjusts at least one of the power supply voltage of the semiconductor memory and the substrate bias voltage using the voltage correction value determined for each semiconductor memory.

3. The apparatus for compensating for radiation tolerance of a semiconductor memory according to claim 1, wherein the semiconductor memory is mounted with a plurality of the latch circuits, the voltage value acquisition unit acquires data retention voltage values of a part or all of the plurality of the latch circuits, and the correction value determination unit calculates a feature value of the data retention voltage values by statistically processing a plurality of the data retention voltage values acquired by the voltage value acquisition unit and determines the voltage correction value based on a difference between the calculated feature value of the data retention voltage values and the reference voltage value.

4. An electronic circuit comprising:

the apparatus for compensating for radiation tolerance of a semiconductor memory according to claim 1; and the semiconductor memory.

5. A method for compensating for radiation tolerance of a semiconductor memory having a latch circuit, the method comprising:

a voltage value acquisition step of acquiring a data retention voltage value, the data retention voltage value corresponding to a maximum voltage at which data is inverted, when a power supply voltage of the semiconductor memory is lowered;

a correction value determination step of determining a voltage correction value based on a difference between the data retention voltage value and a reference voltage value; and a voltage adjustment step of adjusting at least one of the power supply voltage and a substrate bias voltage using the voltage correction value, wherein the reference voltage value is set to be equal to or lower than the data retention voltage value of a semiconductor memory that satisfies required radiation tolerance.

6. The method for compensating for radiation tolerance of a semiconductor memory according to claim 5, wherein, in the voltage value acquisition step, the data retention voltage value is acquired for each of a plurality of the semiconductor memories, in the correction value determination step, the voltage correction value is determined for each semiconductor memory based on a difference between the data retention voltage value acquired for each semiconductor memory and the reference voltage value that is a common value among the semiconductor memories, and in the voltage adjustment step, at least one of the power supply voltage of each semiconductor memory and the substrate bias voltage is adjusted using the voltage correction value determined for each semiconductor memory.

7. The method for compensating for radiation tolerance of a semiconductor memory according to claim 5, wherein the semiconductor memory is mounted with a plurality of the latch circuits, in the voltage value acquisition step, data retention voltage values of a part or all of the plurality of the latch circuits are acquired, and in the correction value determination step, a feature value of the data retention voltage values is calculated by statistically processing a plurality of the data retention voltage values acquired in the voltage value acquisition step and the voltage correction value is determined based on a difference between the calculated feature value of the data retention voltage values and the reference voltage value.

* * * * *